US012796344B2

(12) United States Patent
Ooike et al.

(10) Patent No.: US 12,796,344 B2
(45) Date of Patent: Nov. 10, 2026

(54) STACKED SUBSTRATE FOR LASER LIFT-OFF, SUBSTRATE PROCESSING METHOD, AND SUBSTRATE PROCESSING APPARATUS

(71) Applicant: Tokyo Electron Limited, Tokyo (JP)

(72) Inventors: Noboru Ooike, Tokyo (JP); Kiyotaka Imai, Tokyo (JP); Yoshihiro Hirota, Tokyo (JP); Motoyuki Sato, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 421 days.

(21) Appl. No.: 18/688,382

(22) PCT Filed: Aug. 19, 2022

(86) PCT No.: PCT/JP2022/031324
§ 371 (c)(1),
(2) Date: Mar. 1, 2024

(87) PCT Pub. No.: WO2023/032706
PCT Pub. Date: Mar. 9, 2023

(65) Prior Publication Data

US 2024/0387176 A1 Nov. 21, 2024

(30) Foreign Application Priority Data

Sep. 2, 2021 (JP) ................................ 2021-142969

(51) Int. Cl.
*H10P 10/00* (2026.01)
*B23K 26/53* (2014.01)
*B23K 101/40* (2006.01)

(52) U.S. Cl.
CPC ............. *H10P 10/12* (2026.01); *B23K 26/53* (2015.10); *B23K 2101/40* (2018.08)

(58) Field of Classification Search
CPC ............ H10P 14/69215; H10P 50/242; H10P 72/0436; H10P 72/7612; H10P 10/12; H10P 95/00; B23K 26/53; B23K 2101/40
See application file for complete search history.

(56) References Cited

U.S. PATENT DOCUMENTS

2004/0245543 A1* 12/2004 Yoo ...................... H10H 20/018 438/22
2009/0092928 A1* 4/2009 Burberry ............. H05K 3/0082 430/315

(Continued)

FOREIGN PATENT DOCUMENTS

CN 110931375 * 3/2020 ........... H10P 74/207

OTHER PUBLICATIONS

Sands et al. Layer Transfer by Bonding and Laser Lift-Off from M. Alexe et al. Wafer Bonding, 2004 (Year: 2004).*

(Continued)

*Primary Examiner* — Galina G Yushina
(74) *Attorney, Agent, or Firm* — Shih IP Law Group, PLLC.

(57) ABSTRACT

A stacked substrate for laser lift-off includes a first substrate that transmits a laser beam, a first insulating layer that absorbs the laser beam, a first polysilicon layer that transmits the laser beam, a second insulating layer that absorbs the laser beam, a second polysilicon layer that transmits the laser beam, and a first device layer in an order. The stacked substrate includes a first electrode penetrating the first insulating layer to electrically connect the first substrate and the first polysilicon layer, and a second electrode penetrating the second insulating layer to electrically connect the first polysilicon layer and the second polysilicon layer. The first electrode and the second electrode contain a material that (Continued)

transmits the laser beam, and are positioned apart from each other without being overlapped when viewed from a top.

8 Claims, 6 Drawing Sheets

(56) References Cited

U.S. PATENT DOCUMENTS

| | | | | |
|---|---|---|---|---|
| 2021/0327702 | A1* | 10/2021 | Kojima | H10P 54/00 |
| 2023/0023577 | A1* | 1/2023 | Yamashita | H10P 95/11 |
| 2023/0069107 | A1* | 3/2023 | Wei | H10D 89/921 |

OTHER PUBLICATIONS

International Search Report of PCT/JP2022/031324 dated Oct. 25, 2022.

Z. Wang et al., "Temperature Effect on Antenna Protection Strategy for Plasma-Process Induced Charging Damage", International Symposium on Plasma and Process-Induced Damage, pp. 134-137, 2002.

* cited by examiner

STACKED SUBSTRATE FOR LASER LIFT-OFF, SUBSTRATE PROCESSING METHOD, AND SUBSTRATE PROCESSING APPARATUS

CROSS-REFERENCE TO RELATED APPLICATIONS

This Application is a U.S. national phase application under 35 U.S.C. § 371 of PCT Application No. PCT/JP2022/031324 filed on Aug. 19, 2022, which claims the benefit of Japanese Patent Application No. 2021-142969 filed on Sep. 2, 2021, the entire disclosures of which are incorporated herein by reference.

TECHNICAL FIELD

The various aspects and embodiments described herein pertain generally to a stacked substrate for laser lift-off, a substrate processing method, and a substrate processing apparatus.

BACKGROUND

When forming a device layer on a substrate such as a silicon wafer, plasma CVD (Chemical Vapor Deposition), plasma ALD (Atomic Layer Deposition), plasma etching, or the like is used. If charged particles are accumulated due to plasma radiation, the device layer is damaged. Thus, it has been proposed to form a discharge path to suppress the device layer from being damaged (see, for example, Non-Patent Document 1).

Non-patent Document 1: Z. Wang, A. Scarpa, S. Smits, C. Salm, F. Kuper, "Temperature Effect on Antenna Protection Strategy for Plasma-Process Induced Charging Damage," International Symposium on Plasma and Process-Induced Damage, pp. 134-137, 2002

SUMMARY

In an exemplary embodiment, a stacked substrate for laser lift-off includes a first substrate that transmits a laser beam, a first insulating layer that absorbs the laser beam, a first polysilicon layer that transmits the laser beam, a second insulating layer that absorbs the laser beam, a second polysilicon layer that transmits the laser beam, and a first device layer in an order. The stacked substrate includes a first electrode penetrating the first insulating layer to electrically connect the first substrate and the first polysilicon layer, and a second electrode penetrating the second insulating layer to electrically connect the first polysilicon layer and the second polysilicon layer. The first electrode and the second electrode contain a material that transmits the laser beam, and are positioned apart from each other without being overlapped when viewed from a top.

DETAILED DESCRIPTION

Figure 1:
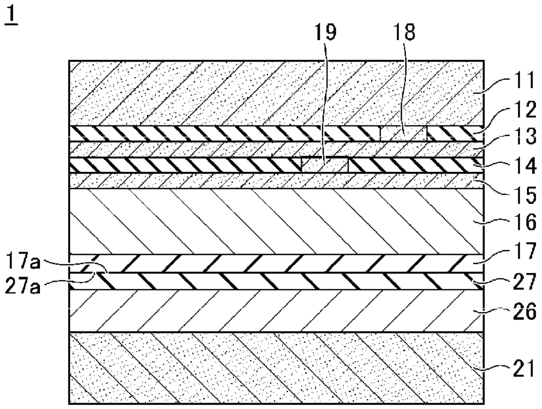
FIG. 1 is a cross sectional view illustrating a stacked substrate according to an exemplary embodiment.

Hereinafter, exemplary embodiments of the present disclosure will be described with reference to the accompanying drawings. In the various drawings, same or corresponding parts will be assigned same reference numerals, and redundant descriptions thereof will be omitted. In the present specification, the expression "when viewed from the top" means being viewed in a direction perpendicular to a surface of a stacked substrate 1 to which a laser beam LB is radiated.

Figure 2:
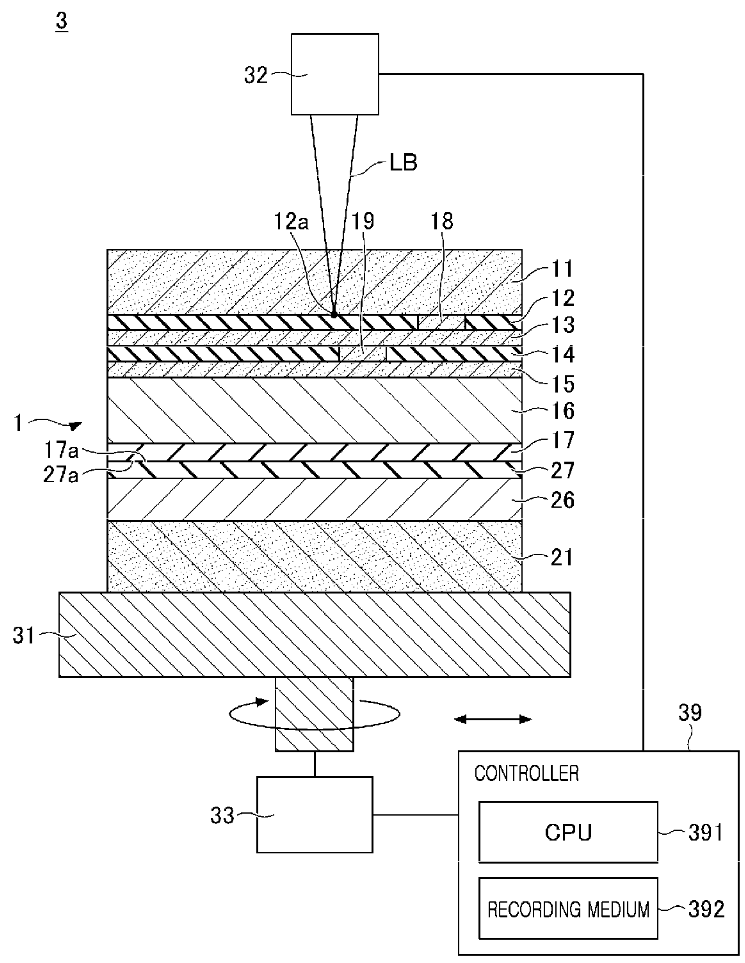
FIG. 2 is a cross sectional view illustrating formation of a separation starting point by a substrate processing apparatus according to the exemplary embodiment.

Referring to FIG. 1, a stacked substrate 1 for laser lift-off according to an exemplary embodiment will be described. The stacked substrate 1 includes, for example, a first substrate 11, a first insulating layer 12, a first polysilicon layer 13, a second insulating layer 14, a second polysilicon layer 15, and a first device layer 16 that are arranged in this order. As will be described in detail later, laser lift-off is a technique of separating the first substrate 11 from the first device layer 16 by using the laser beam LB that penetrates the first substrate 11, as shown in FIG. 2 to FIG. 4.

The first substrate 11 is, for example, a silicon wafer. The first substrate 11 is not limited to the silicon wafer, and may be a compound semiconductor wafer or a glass substrate. The first insulating layer 12, the first polysilicon layer 13, the second insulating layer 14, the second polysilicon layer 15, and the first device layer 16 are formed on one surface of the first substrate 11 in this order. Then, a first bonding layer 17 to be described later may be formed.

Figure 3:
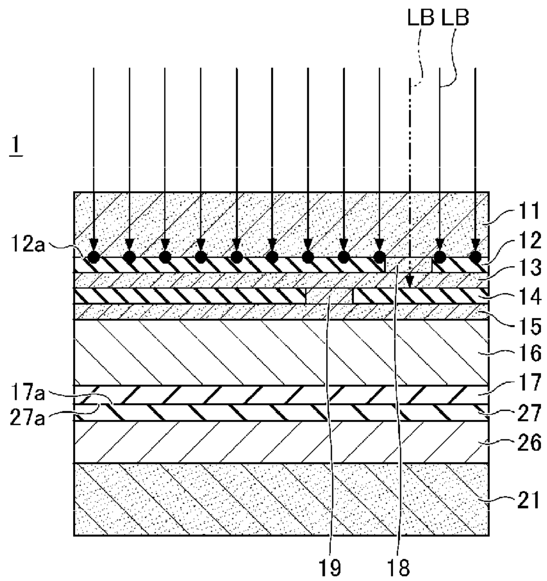
FIG. 3 is a cross sectional view illustrating an example arrangement of separation starting points.
Figure 4:
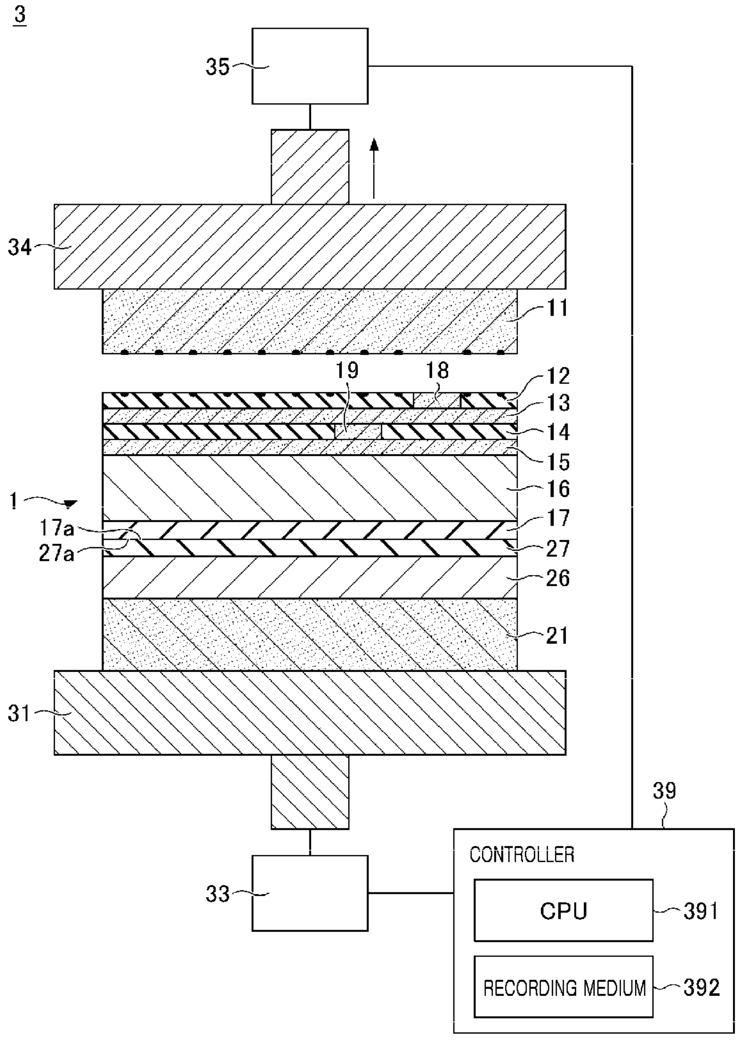
FIG. 4 is a cross sectional view illustrating separation by the substrate processing apparatus according to the exemplary embodiment.

As shown in FIG. 3, the first insulating layer 12 absorbs the laser beam LB and forms a separation starting point 12*a*. A crack is formed at the separation starting point 12*a* due to a shear stress or the like. A modification layer obtained by modifying the first insulating layer 12 may be formed at the separation starting point 12*a*. The separation starting point 12*a* is formed at an interface between the first substrate 11 and the first insulating layer 12, but it may be formed inside the first insulating layer 12.

The first insulating layer 12 has insulation property. A material having insulating property has excellent absorption property for the laser beam LB. The first insulating layer 12 is, for example, an oxide layer. A specific example of the oxide layer may be a silicon oxide layer. The oxide layer is formed by a thermal oxidation method, a CVD (Chemical Vapor Deposition) method, an ALD (Atomic Layer Deposition) method, or the like. When forming a silicon oxide layer by the CVD method, TEOS (Tetra Ethoxy Silane) or the like is used as a source material for the silicon oxide layer. Further, the first insulating layer 12 may be a silicon nitride layer, a silicon carbonitride layer, or the like.

A through hole is formed through the first insulating layer 12. A first electrode 18 is provided in this through hole. The first electrode 18 penetrates the first insulating layer 12 to electrically connect the first substrate 11 and the first polysilicon layer 13. The first electrode 18 is used as a part of a discharge path for discharging charged particles (for example, electrons or holes), that are accumulated in the first device layer 16 when the first device layer 16 is formed, to the first substrate 11.

To form the first device layer 16, plasma CVD, plasma ALD, plasma etching, or the like is used. If charged particles are accumulated due to plasma radiation, the first device layer 16 is damaged. According to the present exemplary embodiment, however, since the first electrode 18 and the like form the discharge path, the damage to the first device layer 16 can be suppressed.

The first electrode 18 contains, for example, polysilicon, and has an impurity concentration of, e.g., equal to or more than $1.0\times10^{19}/cm^3$ and less than $3.0\times10^{20}/cm^3$. The impurity (dopant) may be a donor that provides an electron, or an acceptor that provides a hole. When the impurity concentration is $1.0\times10^{19}/cm^3$ or more, the discharge property is good. When the impurity concentration is less than $3.0\times10^{20}/cm^3$, the first electrode 18 has high transmittance to the laser beam LB.

The first polysilicon layer 13 is a part of the aforementioned discharge path. The first polysilicon layer 13 has an impurity concentration of, e.g., equal to or more than $1.0\times10^{19}/cm^3$ and less than $3.0\times10^{20}/cm^3$. The impurity may be a donor or an acceptor. When the impurity concentration is $1.0\times10^{19}/cm^3$ or more, the discharge property is good. When the impurity concentration is less than $3.0\times10^{20}/cm^3$, the first polysilicon layer 13 has high transmittance to the laser beam LB.

The second insulating layer 14 absorbs the laser beam LB. An absorption rate of the laser beam LB in the second insulating layer 14 is, for example, 70% to 100%. The laser beam LB having high intensity can be suppressed from being radiated to the first device layer 16, so that the damage to the first device layer 16 can be suppressed. The second insulating layer 14 has the same thickness as the first insulating layer 12, but it may have a different thickness as will be described later.

The second insulating layer 14 has an insulation property, the same as the first insulating layer 12. A material having the insulation property has excellent absorption property for the laser beam LB. The second insulating layer 14 is, for example, an oxide layer. A specific example of the oxide layer may be a silicon oxide layer. The oxide layer is formed by a thermal oxidation method, a CVD method, an ALD method, or the like. Furthermore, the second insulating layer 14 may be a silicon nitride layer, a silicon carbonitride layer, or the like.

A through hole is formed in the second insulating layer 14. A second electrode 19 is provided in this through hole. The second electrode 19 penetrates the second insulating layer 14 to electrically connect the first polysilicon layer 13 and the second polysilicon layer 15. The second electrode 19 is a part of the aforementioned discharge path. The second electrode 19 contains, for example, polysilicon, and has an impurity concentration of, e.g., equal to or more than $1.0\times10^{19}/cm^3$ and less than $3.0\times10^{20}/cm^3$. The impurity may be a donor or an acceptor.

The second polysilicon layer 15 is a part of the aforementioned discharge path. The second polysilicon layer 15 has an impurity concentration of, e.g., equal to or more than $1.0\times10^{19}/cm^3$ and less than $3.0\times10^{20}/cm^3$. The impurity may be a donor or an acceptor. When the impurity concentration is $1.0\times10^{19}/cm^3$ or more, the discharge property is good. When the impurity concentration is less than $3.0\times10^{20}/cm^3$, the second polysilicon layer 15 has high transmittance to the laser beam LB.

The first device layer 16 includes, for example, a semiconductor element. The first device layer 16 includes, for example, a 3DNAND cell, a logic cell, a DRAM cell, or the like.

Assume that the stacked substrate 1 is not provided with the second insulating layer 14. In this case, after penetrating the first electrode 18, the laser beam LB may be radiated to the first device layer 16 without being absorbed by the second insulating layer 14. Since the laser beam LB having high intensity is radiated to the first device layer 16, the first device layer 16 may be damaged.

The stacked substrate 1 of the present exemplary embodiment is provided with the second insulating layer 14. Therefore, the laser beam LB is absorbed by the second insulating layer 14 after penetrating the first electrode 18, as indicated by a double-dashed-line arrow in FIG. 3. Therefore, the laser beam LB having high intensity can be suppressed from being radiated to the first device layer 16, so the damage to the first device layer 16 can be suppressed. Outside the first electrode 18, the laser beam LB is absorbed by the first insulating layer 12, as indicated by a solid-line arrow in FIG. 3, and, therefore, the first device layer 16 is not damaged.

Meanwhile, the first polysilicon layer 13, the second polysilicon layer 15, the first electrode 18, and the second electrode 19 contain a material (for example, polysilicon) that transmits the laser beam LB. When viewed from the top (viewed from above in FIG. 3), if the first electrode 18 and the second electrode 19 are overlapped, the laser beam LB passes through the first electrode 18, then passes through the second electrode 19, and reaches the first device layer 16.

In the present exemplary embodiment, when viewed from the top, the first electrode 18 and the second electrode 19 are not overlapped but spaced apart from each other. Accordingly, the laser beam LB is absorbed by the second insulating layer 14 after passing through the first electrode 18, as indicated by the double-dashed-line arrow in FIG. 3. Thus, the radiation of the laser beam LB of high intensity to the first device layer 16 can be suppressed, so that the damage to the first device layer 16 can be suppressed.

On the opposite side from the first substrate 11 with respect to the first device layer 16, the stacked substrate 1 may be provided with the first bonding layer 17, a second bonding layer 27, a second device layer 26, and a second substrate 21 in this order. The first substrate 11 and the second substrate 21 are bonded with the first device layer 16 and the second device layer 26 therebetween.

The first bonding layer 17 is formed on a surface of the first device layer 16. The first bonding layer 17 is an insulating layer such as, but not limited to, a silicon oxide layer. The first bonding layer 17 may include a wiring configured to electrically connect the first device layer 16 and the second device layer 26. The first bonding layer 17 has a bonding surface **17*a* in contact with the second bonding layer 27. Before the first bonding layer 17 and the second bonding layer 27 are put to face each other to be bonded, the bonding surface 17*a*** may be activated with plasma or the like, or may be made hydrophilic by supplying water or water vapor thereto.

The second substrate 21 is, for example, a silicon wafer. However, the second substrate 21 is not limited to the silicon wafer, and may be a compound semiconductor wafer or a glass substrate. On a surface of the second substrate 21 facing the first substrate 11, the second device layer 26 and the second bonding layer 27 are formed in this order.

The second device layer 26 includes, for example, a semiconductor element. The second device layer 26 is electrically connected to the first device layer 16. The second device layer 26 has a function different from that of the first device layer 16. For example, the second device layer 26 includes a CMOS (Complementary Metal Oxide Semiconductor) logic circuit, and the first device layer 16 includes a 3DNAND cell.

Like the first bonding layer 17, the second bonding layer 27 is an insulating layer such as, but not limited to, a silicon oxide layer. The second bonding layer 27 may include a wiring configured to electrically connect the first device layer 16 and the second device layer 26. The second bonding layer 27 has a bonding surface 27*a* in contact with the first bonding layer 17. The bonding surface 27*a* may be activated by plasma or the like, or may be made hydrophilic by supplying water or water vapor thereto.

The first bonding layer 17 and the second bonding layer 27 are bonded by a van der Waals force (intermolecular force) and hydrogen bonds between OH groups. Covalent bonds may be formed through a dehydration condensation reaction of the hydrogen bonds. Since the solid materials are directly attached to each other without using a liquid adhesive, misalignment due to deformation of the adhesive or the like can be suppressed. Further, tilting due to uneven thickness of the adhesive can also be suppressed.

In addition, the stacked substrate 1 needs to include the first substrate 11, the first insulating layer 12, the first polysilicon layer 13, the second insulating layer 14, the second polysilicon layer 15, and the first device layer 16 in this order. The stacked substrate 1 does not need to include the first bonding layer 17, the second bonding layer 27, the second device layer 26, and the second substrate 21.

Now, referring to FIG. 2 to FIG. 4, a substrate processing apparatus 3 and a substrate processing method using the substrate processing apparatus 3 according to the exemplary embodiment will be described. The substrate processing apparatus 3 is configured to separate the first substrate 11 from the first device layer 16 by using the laser beam LB that penetrates the first substrate 11. The substrate processing apparatus 3 includes, for example, a first substrate holder 31, a radiator 32, a first driver 33, a second substrate holder 34, a second driver 35, and a controller 39.

The first substrate holder 31 is configured to hold the stacked substrate 1, as shown in FIG. 2. For example, the first substrate holder 31 holds the stacked substrate 1 horizontally from below, allowing the first substrate 11 to face upwards. The first substrate holder 31 is, for example, a vacuum chuck. The first driver 33 is configured to move the first substrate holder 31 in a horizontal direction and rotate it about a vertical rotation axis. The first driver 33 may be configured to move the first substrate holder 31 in a vertical direction.

The radiator 32 is configured to radiate the laser beam LB to the stacked substrate 1 held by the first substrate holder 31. The laser beam LB is, for example, an infrared ray, and has a wavelength of, e.g., 8.8 μm to 11 μm. The silicon wafer, which is the first substrate 11, has high transparency to the infrared ray, and the first insulating layer 12 has high absorption property for the infrared ray. The separation starting point 12*a* is formed at a point of the first insulating layer 12 to which the laser beam LB is radiated.

The radiator 32 includes an oscillator that oscillates the laser beam LB. The oscillator oscillates the laser beam LB in a pulse shape. The oscillator is, for example, a $CO_2$ laser. The $CO_2$ laser has a wavelength of approximately 9.3 μm. The radiator 32 may include a condensing lens. The condensing lens condenses the laser beam LB toward the stacked substrate 1.

The radiator 32 may include a galvano scanner or a polygon scanner in order to move the radiation point of the laser beam LB on the stacked substrate 1. Further, the radiation point of the laser beam LB on the stacked substrate 1 may be moved as the first driver 33 moves the first substrate holder 31 in the horizontal direction or rotates it about the vertical rotation axis. In this case, the galvano scanner or the like is not necessary.

The second substrate holder 34 is configured to hold the stacked substrate 1, as shown in FIG. 4. The second substrate holder 34 holds the stacked substrate 1 from the opposite side from the first substrate holder 31 (for example, from above). The second substrate holder 34 is, for example, a vacuum chuck. The second driver 35 moves the second substrate holder 34 in a horizontal direction, and rotates it about a vertical rotation axis. The second driver 35 may move the second substrate holder 34 in a vertical direction.

The controller 39 is, for example, a computer, and includes a CPU (central processing unit) 391 and a recording medium 392 such as a memory. The recording medium 392 stores therein a program that controls various processings performed in the substrate processing apparatus 3. The controller 39 controls the operation of the substrate processing apparatus 3 by causing the CPU 391 to execute the program stored in the recording medium 392.

The controller 39 controls the radiator 32 and the first driver 33 to form the separation starting point 12*a* at the interface between the first substrate 11 and the first insulating layer 12. A plurality of separation starting points 12*a* are formed at intervals therebetween in a radial direction and a circumferential direction of the first substrate 11. The plurality of separation starting points 12*a* may be arranged concentrically, or may be arranged in a spiral shape. Further, the separation starting points 12*a* may be formed inside the first insulating layer 12 as mentioned above.

Afterwards, the controller 39 controls the second driver 35 to separate the first substrate 11 from the first device layer 16. For example, in the state that the first substrate holder 31 attracts the second substrate 21 and the second substrate holder 34 attracts the first substrate 11, the second driver 35 raises the second substrate holder 34. A crack connecting the plurality of separation starting points 12*a* in a planar shape is formed, and the first substrate 11 is separated from the first device layer 16.

Further, the controller 39 may lower the first substrate holder 31 instead of or in addition to raising the second substrate holder 34. The controller 39 needs to relatively move the first substrate holder 31 and the second substrate holder 34 apart in the vertical direction. The controller 39 may rotate the first substrate holder 31 or the second substrate holder 34.

Figure 5:
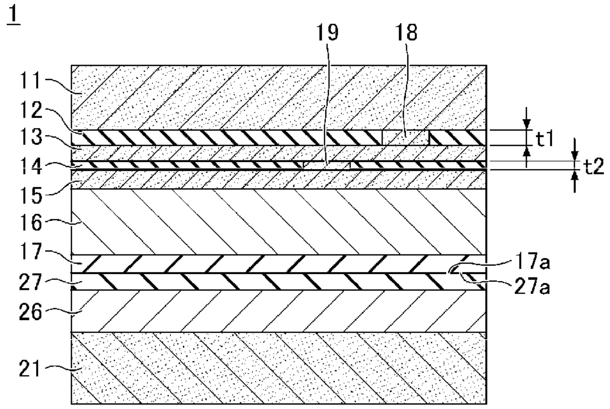
FIG. 5 is a cross sectional view illustrating a stacked substrate according to a first modification example.

Now, referring to FIG. 5, the stacked substrate 1 for laser lift-off according to a first modification example will be described. The following description will focus on a difference between the first modification example and the above-described exemplary embodiment. As shown in FIG. 5, a thickness t1 of the first insulating layer 12 may be larger than a thickness t2 of the second insulating layer 14. The thickness t1 of the first insulating layer 12 is, for example, larger than 1.0 μm. The thickness t2 of the second insulating layer 14 is, for example, 0.5 μm to 1.0 μm.

Figure 6:
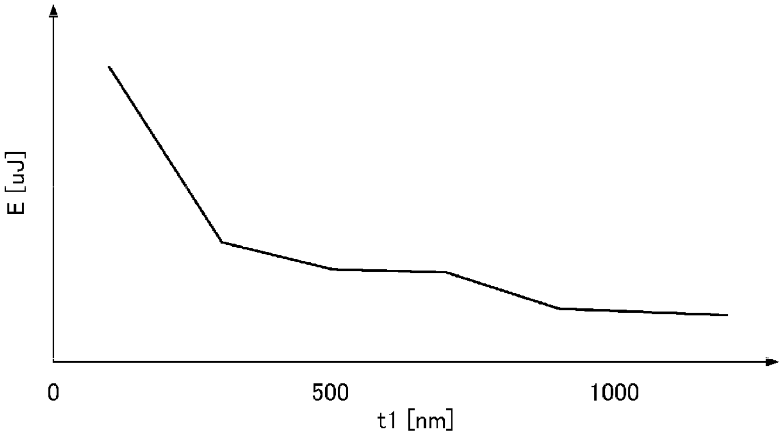
FIG. 6 is a diagram illustrating an example of a relationship between a thickness of a first insulating layer and energy of a laser beam required to form the separation starting point.

FIG. 6 shows an example of a relationship between the thickness t1 of the first insulating layer 12 and energy E of the laser beam LB required for the formation of the separation starting point 12*a*. As shown in FIG. 6, the larger the thickness t1 of the first insulating layer 12, the lower the required energy E becomes. This is because the larger the thickness t1 of the first insulating layer 12, the higher the absorptance of the laser beam LB by the first insulating layer 12, making it easier to generate heat, so a required shear stress is obtained with the low energy E.

If the thickness t1 of the first insulating layer 12 is larger than the thickness t2 of the second insulating layer 14, the separation starting point 12*a* can be formed in the first insulating layer 12 by using the laser beam LB of the low energy E. Besides, it is also possible to suppress formation of a separation starting point in the second insulating layer 14. Thus, occurrence of separation at an unintended location can be suppressed.

In addition, the sizes of the thickness t1 of the first insulating layer 12 and the thickness t2 of the second insulating layer 14 may be reversed, so the thickness t2 of the second insulating layer 14 may be larger than the thickness t1 of the first insulating layer 12. In this case, the separation starting point 12*a* is formed at an interface between the first polysilicon layer 13 and the second insulating layer 14, or inside the second insulating layer 14.

Figure 7:
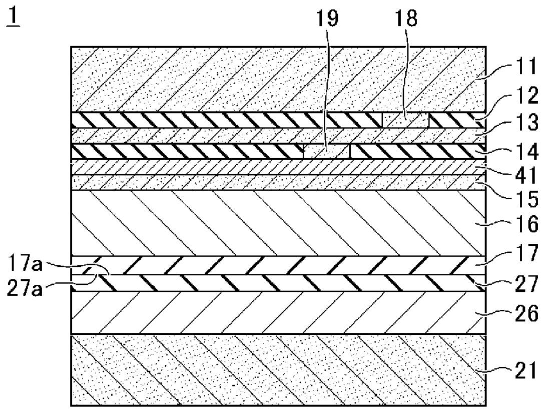
FIG. 7 is a cross sectional view illustrating a stacked substrate according to a second modification example.

Now, referring to FIG. 7, the stacked substrate 1 for laser lift-off according to a second modification example will be discussed. The following description will focus on a difference between the second modification example and the above-described exemplary embodiment. As illustrated in FIG. 7, the stacked substrate 1 may have, between the second insulating layer 14 and the second polysilicon layer 15, a conductive layer 41 that reflects the laser beam LB. A reflectance of the laser beam LB on the conductive layer 41 is, for example, 70% to 100%.

The conductive layer 41 is a part of the aforementioned discharge path. The conductive layer 41 contains, for example, a transition metal, a conductive oxide, polysilicon. The transition metal includes, for example, at least one selected from the group consisting of Cu, Co, Ru, Mo, W, and Ti. The conductive oxide includes, by way of example, IGZO (an oxide containing indium, gallium, and zinc) or ITO (indium tin oxide). The polysilicon contained in the conductive layer 41 has an impurity concentration higher than that of the second polysilicon layer 15. For example, it has an impurity concentration in the range of $3.0\times10^{20}/cm^3$ to $3.0\times10^{21}/cm^3$ inclusive.

By reflecting the laser beam LB, the conductive layer 41 can reduce the intensity of the laser beam LB reaching the first device layer 16, so that the damage to the first device layer 16 can be certainly suppressed.

So far, the exemplary embodiment of the stacked substrate for laser lift-off, the substrate processing method and the substrate processing apparatus according to the present disclosure has been described. However, the present disclosure is not limited to the above-described exemplary embodiment, etc. Various changes, corrections, replacements, addition, deletion and combinations may be made within the scope of the claims, and all of these are included in the scope of the inventive concept of the present disclosure.

This application claims priority to Japanese Patent Application No. 2021-142969, filed on Sep. 2, 2021, which application is hereby incorporated by reference in their entirety.

According to the exemplary embodiment, it is possible to suppress the radiation of the laser beam to the device layer through the discharge path, thus suppressing the damage to the device layer.

We claim:

1. A stacked substrate for laser lift-off, comprising:

a first substrate that transmits a laser beam, a first insulating layer that absorbs the laser beam, a first polysilicon layer that transmits the laser beam, a second insulating layer that absorbs the laser beam, a second polysilicon layer that transmits the laser beam, and a first device layer in an order; and a first electrode penetrating the first insulating layer to electrically connect the first substrate and the first polysilicon layer, and a second electrode penetrating the second insulating layer to electrically connect the first polysilicon layer and the second polysilicon layer, wherein the first electrode and the second electrode contain a material that transmits the laser beam, and are positioned apart from each other without being overlapped when viewed from a top.

2. The stacked substrate for laser lift-off of claim 1, wherein the first electrode and the second electrode contain polysilicon.

3. The stacked substrate for laser lift-off of claim 1, wherein a thickness of a first one of the first insulating layer and the second insulating layer is larger than a thickness of a second one of the first insulating layer and the second insulating layer.

4. The stacked substrate for laser lift-off of claim 1, further comprising:

a conductive layer that reflects the laser beam, the conductive layer being disposed between the second insulating layer and the second polysilicon layer.

5. The stacked substrate for laser lift-off of claim 1, wherein the first insulating layer and the second insulating layer are silicon oxide layers.

6. The stacked substrate for laser lift-off of claim 1, further comprising:

a second device layer electrically connected to the first device layer, and a second substrate on which the second device layer is formed, wherein the first substrate and the second substrate are bonded to each other with the first device layer and the second device layer therebetween.

7. A substrate processing method, comprising:

preparing a stacked substrate for laser lift-off as claimed in claim 1; and forming a separation starting point at an interface between the first substrate and the first insulating layer, inside the first insulating layer, at an interface between the first polysilicon layer and the second insulating layer, or inside the second insulating layer by radiating the laser beam to the first insulating layer through the first substrate.

8. A substrate processing apparatus, comprising:

a substrate holder configured to hold a stacked substrate for laser lift-off as claimed in claim 1;

a radiator configured to radiate the laser beam to the stacked substrate held by the substrate holder; and a controller configured to control the radiator, wherein the controller performs a control of forming a separation starting point at an interface between the first substrate and the first insulating layer, inside the first insulating layer, at an interface between the first polysilicon layer and the second insulating layer, or inside the second insulating layer by radiating the laser beam to the first insulating layer through the first substrate.

* * * * *